US006268110B1

(12) United States Patent
Gates et al.

(10) Patent No.: US 6,268,110 B1
(45) Date of Patent: Jul. 31, 2001

(54) HEAT SENSITIVE PLATE PRECURSOR

(75) Inventors: Allen Peter Gates, North Yorkshire; Philip John Watkiss, Leeds, both of (GB); Fredrick Claus Zumsteg, Jr., Wilmington, DE (US)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/445,075

(22) PCT Filed: Jun. 3, 1998

(86) PCT No.: PCT/EP98/03482

§ 371 Date: Feb. 7, 2000

§ 102(e) Date: Feb. 7, 2000

(87) PCT Pub. No.: WO98/55310

PCT Pub. Date: Dec. 10, 1998

(30) Foreign Application Priority Data

Jun. 3, 1997 (GB) .................................................. 9711391

(51) Int. Cl.[7] .......................... G03C 1/494; G03C 1/705; G03F 7/06; G03F 7/004; G03F 7/11

(52) U.S. Cl. .................. 430/273.1; 430/204; 430/278.1; 430/276.1; 430/302; 430/330; 430/616; 430/964

(58) Field of Search .................................... 430/204, 616, 430/964, 273.1, 278.1, 276.1, 302, 330

(56) References Cited

U.S. PATENT DOCUMENTS 3,508,924 * 4/1970 Pickard .
5,401,611 * 3/1995 Edwards et al. ..................... 430/616
5,908,731 * 6/1999 Leenders et al. ................. 430/273.1
5,916,734 * 6/1999 Takagami et al. ................... 430/616
5,985,515 * 11/1999 Van Rompuy et al. .......... 430/272.1
6,068,965 * 5/2000 Hauguier et al. ................. 430/273.1
6,114,094 * 9/2000 Ishiguro et al. ..................... 430/616
6,132,934 * 10/2000 Vermeersch et al. ................ 430/204
6,132,938 * 10/2000 Yoshida et al. ...................... 430/616

FOREIGN PATENT DOCUMENTS

12673 * 6/1980 (EP) .
609941 * 8/1994 (EP) .
816071 * 1/1998 (EP) .
1139613 * 1/1969 (GB) .
52-037104 * 3/1977 (JP) .
60-072792 * 4/1985 (JP) .

* cited by examiner

*Primary Examiner*—Richard L. Schilling
(74) *Attorney, Agent, or Firm*—Breiner & Breiner, L.L.C.

(57) ABSTRACT

A lithographic printing plate precursor comprises a grained and anodised aluminium substrate coated with a metallic layer, preferably a silver layer, on top of which is applied a layer of an oleophilic resin. Imagewise exposure of the precursor by means of a high intensity laser beam allows for the direct provision of press ready plates showing increased cleanliness in background areas and providing excellent start-up properties on press, high image quality and improved press durability, without the requirement for the use of intermediate film and developer chemistry, or the need for any post-exposure processing. Lower levels of metal deposition on the substrate surface result in the plate precursors showing enhanced sensitivity on exposure, whereupon removal of the metallic layer occurs in the exposed areas.

9 Claims, No Drawings

HEAT SENSITIVE PLATE PRECURSOR

This invention relates to the formation of images directly from electronically composed digital sources and is particularly concerned with the formation of images on lithographic printing plate precursors. More particularly, the invention relates to lithographic printing plate precursors which incorporate an imaging layer comprising metallic silver, and a method of preparing lithographic printing plates which does not require the use of chemical treatments.

Lithographic printing is a process of printing from surfaces which have been prepared in such a way that certain areas are capable of accepting ink (oleophilic areas), whereas other areas will not accept ink (oleophobic areas). The oleophilic areas form the printing areas while the oleophobic areas form the background areas.

Plates for use in lithographic printing processes may be prepared using a photographic material that is made imagewise receptive or repellent to ink upon photo-exposure of the photographic material and subsequent chemical treatment. However, this method of preparation, which is based on photographic processing techniques, involves several steps, and therefore requires a considerable amount of time, effort and expense.

Consequently it has, for many years, been a long term aim in the printing industry to form images directly from an electronically composed digital database, ie by a so-called "computer-to-plate" system. The advantages of such a system over the traditional methods of making printing plates are:

(i) the elimination of costly intermediate silver film and processing chemicals;

(ii) a saving of time; and (iii) the ability to automate the system with consequent reduction in labour costs.

The introduction of laser technology provided the first opportunity to form an image directly on a printing plate precursor by scanning a laser beam across the surface of the precursor and modulating the beam so as to effectively turn it on and off. In this way, radiation sensitive plates comprising a high sensitivity polymer coating have been exposed to laser beams produced by water cooled UV argon-ion lasers and electrophotographic plates having sensitivities stretching into the visible spectral region have been successfully exposed using low powered air-cooled argon-ion, helium-neon and semiconductor laser devices.

Imaging systems are also available which involve a sandwich structure which, on exposure to a heat generating infra-red laser beam, undergoes selective (imagewise) delamination and subsequent transfer of materials. Such so-called peel-apart systems are generally used as replacements for silver halide films.

A digital imaging technique has been described in U.S. Pat. No. 4,911,075 whereby a so-called driographic plate which does not require dampening with an aqueous fountain solution to wet the non-image areas during printing is produced by means of a spark discharge. In this case, a plate precursor comprising an ink-repellent coating containing electrically conductive particles coated on a conductive substrate is used and the coating is ablatively removed from the substrate. Unfortunately, however, the ablative spark discharge provides images having relatively poor resolution.

It is known to improve this feature by the use of lasers to obtain high resolution ablation as described, for example, by P E Dyer in "Laser Ablation of Polymers" (Chapter 14 of "Photochemical Processing of Electronic Materials", Academic Press, 1992, p359–385). Until recently, imaging via this method generally involved the use of high power carbon dioxide or excimer lasers. Unfortunately, such lasers are not well-suited to printing applications because of their high power consumption and excessive cost, and the requirement for high pressure gas handling systems. Recent developments have, however, led to the availability of more suitable infra-red diode lasers, which are compact, highly efficient and very economical solid state devices. High power versions of such lasers, which are capable of delivering up to 3000 $mJ/cm^2$, are now commercially available.

Coatings which may be imaged by means of ablation with infra-red radiation have previously been proposed. Thus, for example, a proofing film in which an image is formed by imagewise ablation of a coloured layer on to a receiver sheet is described in PCT Application No 90/12342. This system is, however, disadvantageous in requiring a physical transfer of material in the imaging step, and such methods tend to give rise to inferior image resolution.

Much superior resolution is obtained by means of the ablation technique described in European Patent No 649374, wherein a driographic printing plate precursor is imaged digitally by means of an infra-red diode laser or a YAG laser, and the image is formed directly through the elimination of unwanted material. The technique involves exposing a plate precursor, incorporating an infra-red radiation ablatable coating covered with a transparent cover sheet, by directing the beam from an infra-red laser at sequential areas of the coating so that the coating ablates and loses its ink repellancy in those areas to form an image, removing the cover sheet and ablation products, and inking the image.

A heat mode recording material is disclosed in U.S. Pat. No. 4,034,183 which comprises an anodised aluminium support coated with a hydrophilic layer. On imagewise exposure using a laser, the exposed areas are rendered hydrophobic, and thereby accept ink.

Japanese patent application laid open to public inspection No 49-117102 (1974) discloses a method for producing printing plates wherein a metal is incorporated in the imaging layer of a printing plate precursor which is imaged by irradiation with a laser beam modulated by electric signals. Typically, the plate precursor comprises a metal base, such as aluminium, coated with a resin film, which is typically nitrocellulose, and on top of which has been provided a thin layer of copper. The resin and metal layers are removed in the laser-struck areas, thereby producing a printing plate. The disadvantage of this system, however, is that two types of laser beam irradiation are required in order to remove firstly the copper (eg by means of an argon-ion laser) and then the resin (eg with a carbon dioxide laser); hence, the necessary equipment is expensive.

Subsequently a method of printing plate production which obviated the requirement for a second laser exposure was disclosed in Japanese patent application laid open to public inspection No 52-37104 (1977). Thus, a printing plate precursor comprising a support, typically aluminium, an anodic aluminium oxide layer. and a layer of brass, silver, graphite or, preferably, copper is exposed to a laser beam of high energy density in order to render the exposed areas hydrophilic to yield a printing plate. The printing plate precursor is, however, of rather low sensitivity and requires the use of a high energy laser for exposure.

An alternative heat mode recording material for making a lithographic printing plate is disclosed in European Patent No 609941, which comprises a support having a hydrophilic surface, or provided With a hydrophilic layer, on which is coated a metallic layer, on top of which is a hydrophobic layer having a thickness of less than 50 nm. A lithographic printing plate may be produced from the said material by imagewise exposing to actinic radiation, thereby rendering the exposed areas hydrophilic and repellent to greasy ink.

Conversely, European Patent No 628409 discloses a heat mode recording material for making a lithographic printing plate which comprises a support and a metallic layer, on top of which is provided a hydrophilic layer having a thickness of less than 50 nm. A lithographic printing plate is produced by imagewise exposing the material to actinic radiation in order to render the exposed areas hydrophobic and receptive to greasy ink.

In each of the two foregoing heat mode recording materials, however, difficulties in printing will be encountered. On exposure of the materials to actinic radiation, the energy is converted to heat in the image areas by interaction with the metallic layer, thereby destroying the hydrophilicity or hydrophobicity - depending on the material employed—of the topmost layer in those areas. Consequently, the surface of the metallic layer becomes exposed, and the success of the printing operation is dependent upon differences in hydrophilicity and oleophilicity between the metallic surface and the hydrophilic or hydrophobic layer, as the case may be. Since the metallic layer functions as the hydrophobic surface in one case, and as the hydrophilic surface in the alternative case, it would be expected that such differences in hydrophilicity and oleophilicity would not be sufficiently clearly defined so as to provide a satisfactory printing surface. Furthermore, when a hydrophilic layer is present, and the metallic surface functions as the oleophilic areas of the plate, image areas will necessarily be printed from the metallic surface; such an arrangement is known to be unsatisfactory, and to result in difficulties in achieving acceptable printing quality.

It is an object of the present invention to provide a lithographic printing plate having excellent printing properties, and a method of making said plate which obviates the requirement for the use of processing developers after exposure.

It is a further object of the present invention to provide a method of preparing a lithographic printing plate which does not require the use of costly intermediate film and relies on direct-to-plate exposure techniques.

It is a still further object of the present invention to provide a method of producing a lithographic printing plate in which a high quality image results from the ablation of a metallic layer from a hydrophilic support, thus providing a high degree of differentiation between hydrophilic and oleophilic areas.

It is an additional objective of the present invention to provide a lithographic printing plate precursor in which ablation of a metallic layer in non-image areas may be achieved with lower energy exposure levels.

In order to facilitate the use of lower energy exposure levels, it is necessary to reduce the extent of the deposition of metal on the substrate of the lithographic printing plate precursor without, as a consequence, causing a detrimental effect on other plate properties, such as plate durability on the press.

It has been found that increased sensitivity to heat mode laser exposure can be achieved by deposition of a metallic layer on to a hydrophilic substrate and subsequent overcoating of the metallic layer with a layer of an oleophilic resin. In this way, it is possible to reduce the amount of the metal layer which is deposited, thereby facilitating easier removal of the metal layer in non-image areas. Consequently, in addition to providing enhanced sensitivity for such plates, it is also observed that improved cleanliness can be achieved in the background non-image areas. A further benefit that results from such a system is an increase in durability of the plates on the press, and this is achieved across the whole range of metal deposition weights.

Additionally, it is also the case that plates produced from precursors of this type require no further treatment prior to use on the press. Therefore, no additional chemical treatment is required in order to ensure clean start-up, and significant savings accrue in terms of time and materials, and the requirement for waste treatment and disposal of chemicals is eliminated.

According to a first aspect of the present invention, there is provided a lithographic printing plate precursor comprising:

(i) a grained and anodised aluminium substrate, having coated thereon (ii) a metallic layer, on top of which is applied (iii) a layer of an oleophilic resin The substrate employed in the present invention is an aluminium substrate which has been electrochemically grained and anodised on at least one surface in order to enhance its lithographic properties. Optionally, the aluminium may be laminated to other materials, such as paper or various plastics materials, in order to enhance its flexibility, whilst retaining the good dimensional stability associated with aluminium.

The metallic layer, which is applied to the grained and anodised surface of the aluminium, may comprise any of several metals, specific examples of which include copper, bismuth and brass. Most preferably, however, the metallic layer comprises a silver layer. The average thickness of the metallic layer is preferably from 20 nm to 150 nm, most preferably from 30 nm to 50 nm. This corresponds to an average deposition weight in the range from 0.2 $g/m^2$ to 1.5 $g/m^2$, most preferably from 0.3 $g/m^2$ to 0.5$g/m^2$.

Various techniques are available for the application of the metallic layer to the grained and anodised aluminium substrate, including vapour or vacuum deposition or sputtering. In the case where the metal layer comprises a silver layer, however, the most preferred method for applying the layer involves the treatment of a silver halide photographic material according to the silver salt diffusion transfer process.

In the diffusion transfer process, a silver halide emulsion layer is transformed by treatment with a so-called silver halide solvent, into soluble silver complex compounds which are then allowed to diffuse into an image receiving layer and are reduced therein by means of a developing agent, generally in the presence of physical development nuclei, to form a metallic silver layer.

Two such systems are available: a two sheet system in which a silver halide emulsion layer is provided on one element, and a physical development nuclei layer is provided on a second element, the two elements are placed in contact in the presence of developing agent(s) and silver halide solvent(s) in the presence of an alkaline processing liquid, and subsequently peeled apart to provide a metallic silver layer on the second element; and a single sheet system wherein the element is provided with a physical development nuclei layer, a silver halide emulsion layer is provided on top thereof, the element is treated with developing agent(s) and silver halide solvent(s) in the presence of an alkaline processing liquid, and the element is washed to remove spent emulsion layer and leave a metallic silver layer which is formed in the layer containing physical development nuclei.

Alternatively, the diffusion transfer process may be used to apply a metallic silver layer by overall exposing a positive working silver halide emulsion layer to form a latent negative image which is then developed in contact with a physical development nuclei layer to form a metallic silver layer. Again., the process may be carried out using either a single sheet or a double sheet system.

The principles of the silver complex diffusion transfer process are fully described in the publication "Photographic Silver Halide Diffusion Processes" by Andre Rott and Edith Weyde, The Focal Press, London and New York, 1972, and further detail may be gleaned by reference thereto.

The oleophilic resin comprises any non-photosensitive resin which may be employed as an oleophilic component in a lithographic printing plate coating. Typical resins of this type include phenol- and cresol-formaldehyde resins, novolak resins, resol resins, epoxy resins, acrylate resins, and poly(vinyl acetal) resins, such as poly(vinyl butyral), modified by reacting a proportion of the residual pendant hydroxy groups with an intramolecular cyclic anhydride, typically phthalic anhydride or maleic anhydride. The oleophilic resin is present in a layer having a thickness of from 50 nm to 5000 nm, preferably from 100 nm to 3000 nm, which equates to an average coating weight of from 0.05 $g/m^2$ to 5.0 $g/m^2$, preferably from 0.1 $g/m^2$ to 3.0 $g/m^2$.

The oleophilic layer may be applied to the surface of the metallic layer by coating a solvent-based solution of the resin on top of the metallic layer using any of the standard known techniques, such as spin coating, dip coating, gravure coating, meniscus coating and the like. Suitable solvents for the preparation of the solutions include, for example, ketones such as dimethyl ketone and methyl ethyl ketone, lower alcohols including isopropanol and n-butanol, and hydroxy ethers or their esters, for example 2-propoxyethanol or 2-methoxyethyl acetate.

Optionally, an adhesive layer may be present between the oleophilic resin layer and the metallic layer.

According to a second aspect of the present invention, there is provided a method of preparing a lithographic printing plate, said method comprising:

providing a lithographic printing plate precursor as hereinbefore described; and b) imagewise exposing said precursor by means of a high intensity laser beam.

The precursor is imaged by a beam of radiation, preferably from a laser operating in the infra-red region of the spectrum. Examples of suitable infra-red lasers include semiconductor lasers and YAG lasers, for example the Gerber Crescent 42T Platesetter with a 10W YAG laser outputting at 1064 nm. Exposure to the beam of radiation causes ablation of the metallic layer to occur in the radiation-struck areas.

Reduced levels of exposure are required when compared with those applied to precursors having a greater deposition of metal on the substrate surface. The plates required show increased cleanliness in background areas, and give excellent start-up properties on press and high image quality, without the need for further plate processing following exposure, other than an optional treatment with a plate storage gum. Additionally, improved durability on press is observed.

The platemaking process does not require the use of costly intermediate film, developing and processing chemicals, and eliminates the attendant inconvenience resulting from the use of these materials.

The following example is illustrative of the invention, without placing any limit on the scope thereof:

EXAMPLE

Samples of a commercially available Howson SILVERLITH® SDB printing plate, supplied by DuPont Printing and Publishing, were processed without exposure through an automatic processor by means of the diffusion transfer reversal method, in accordance with the general recommendations of the manufacturer, but alternative processor settings were employed in order to generate samples having different deposition weights or thicknesses of silver. The final stage of applying a specified finishing gum was omitted in each case. The resulting samples of printing plate precursors each comprised a grained and anodised aluminium substrate, on the anodised surface of which was coated a layer of silver.

Samples of the plate precursor were then overcoated with the following oleophilic resins by spin coating solutions of the resins in a suitable solvent, such as methyl ethyl ketone, on to the silver surface of the precursor:

Resin A Epikote® 1007 (an epoxy resin)

Resin B Poly(vinyl butyral) modified by reacting a proportion of the residual pendant hydroxy groups with phthalic anhydride.

Resin C Novolak resin (a cresol-formaldehyde condensate).

The resulting assemblies were then loaded on to a Gerber Crescent 42T internal drum Laser Platesetter fitted with an extraction system comprising a curved nozzle about 1 cm from the plate surface, an air suction pump and a 0.3 μm HEPA filter for removal of ablation debris and imagewise exposed to a 10 W YAG laser outputting at a wavelength of 1064 nm. In each case, the peak power density required to ablate the silver in the exposed areas was recorded. The lithographic plates so produced were mounted on a Drent Web Offset printing press and prints were produced.

For each sample of plate, the durability of the image was measured by recording the number of good quality copies produced. The results obtained are shown in Table 1, and illustrate the advantages provided by the invention.

TABLE 1

| Test No | Silver Weight ($g/m^2$) | Average Silver Thickness (nm) | Resin Coating ($g/m^2$) | Peak Power Density ($MW/cm^2$) | Press Durability (No of copies) |
|---|---|---|---|---|---|
| 1 | 0.3 | 10 | none | 4 | 10000 |
| 2 | 0.8 | 30 | none | 8 | 80000 |
| 3 | 0.3 | 10 | A (0.8) | 5 | 150000 |
| 4 | 0.3 | 10 | B (1.0) | 4.5 | 160000 |
| 5 | 0.3 | 10 | C (1.0) | 5 | 200000 |
| 6 | 0.8 | 30 | A (0.8) | 8.5 | 180000 |

What is claimed is:

1. A lithographic printing plate precursor comprising:

(i) a grained and anodised aluminium substrate having coated thereon (ii) a metallic layer on top of which is applied (iii) a layer of an oleophilic resin.

2. A lithographic printing plate precursor as defined in claim I wherein said metallic layer comprises a silver layer.

3. A lithographic printing plate precursor as defined in claim 2 wherein said silver layer is applied by means of the silver salt diffusion transfer process.

4. A lithographic printing plate precursor as defined in claim 1, 2 or 3 wherein said metallic layer has a thickness of from 20 nm to 150 nm and an average deposition weight of from 0.2 $g/m^2$ to 1.5 $g/m^2$.

5. A lithographic printing plate precursor as defined in claim 4 wherein said thickness is from 30 nm to 50 nm and said average deposition weight is from 0.3 $g/m^2$ to 0.5 $g/m^2$.

6. A lithographic printing plate precursor as defined in claims 1–5 wherein said oleophilic resin comprises a phenol-formaldehyde or cresol-formaldehyde resin, a novolak resin, a resol resin, an epoxy resin, an acrylate resin or a poly(vinyl acetal) resin modified by reaction of a proportion of the residual pendant hydroxy groups with an intramolecular cyclic anhydride.

7. A lithographic printing plate precursor as defined in claim 6 wherein said poly(vinyl acetal) resin is poly(vinyl butyral) and said intramolecular cyclic anhydride is phthalic anhydride or maleic anhydride.

8. A lithographic printing plate precursor as defined in claims 1–7 wherein said oleophilic resin layer has a thickness of from 50 nm to 5000 nm and an average coating weight of from 0.05 $g/m^2$ to 5.0 $g/m^2$.

9. A method of preparing a lithographic printing plate, said method comprising:

(a) providing a lithographic printing plate precursor as defined in any of claims 1–8; and (b) imagewise exposing said precursor by means of a high intensity laser beam.

* * * * *